United States Patent [19]
Ramsbey et al.

[11] Patent Number: 5,972,751
[45] Date of Patent: Oct. 26, 1999

[54] METHODS AND ARRANGEMENTS FOR INTRODUCING NITROGEN INTO A TUNNEL OXIDE IN A NON-VOLATILE SEMICONDUCTOR MEMORY DEVICE

[75] Inventors: Mark Ramsbey, Sunnyvale; Sameer Haddad; Vei-Han Chan, both of San Jose; Yu Sun, Saratoga; Chi Chang, Redwood City, all of Calif.

[73] Assignee: Advanced Micro Devices, Inc., Sunnyvale, Calif.

[21] Appl. No.: 09/143,090

[22] Filed: Aug. 28, 1998

[51] Int. Cl.$^6$ .................................................... H01L 21/336
[52] U.S. Cl. .......................... 438/257; 438/262; 438/264; 438/528; 438/593
[58] Field of Search ..................... 438/257, 262, 438/264, 528, 520, 593, 594, 910, 918

[56] References Cited

U.S. PATENT DOCUMENTS

| | | | |
|---|---|---|---|
| 4,683,637 | 8/1987 | Varker et al. | 438/294 |
| 5,610,084 | 3/1997 | Solo de Zaldivar | 438/600 |
| 5,759,897 | 6/1998 | Kadosh et al. | 438/286 |
| 5,837,585 | 11/1998 | Wu et al. | 438/264 |
| 5,861,347 | 1/1999 | Maiti et al. | 438/787 |

*Primary Examiner*—Carl Whitehead, Jr.
*Assistant Examiner*—Khanh B. Duong

[57] ABSTRACT

Methods and arrangements are provided for introducing nitrogen into a tunnel oxide layer within a stacked gate structure of a non-volatile memory cell. The nitrogen is advantageously introduced into only a select portion of the tunnel oxide, preferably nearer the source region of the memory cell. This prevents the unwanted or residual nitrogen from detrimentally affecting other devices within the semiconductor integrated circuit.

7 Claims, 3 Drawing Sheets

METHODS AND ARRANGEMENTS FOR INTRODUCING NITROGEN INTO A TUNNEL OXIDE IN A NON-VOLATILE SEMICONDUCTOR MEMORY DEVICE

FIELD OF THE INVENTION

The present invention relates to semiconductor devices and manufacturing processes, and more particularly to methods and arrangements for introducing nitrogen into a tunnel oxide within a non-volatile memory semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell call be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicoln.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge needs to be removed from floating gate 16 by way of an erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer. The thickness and physical properties of interpoly dielectric layer 24 affect the data retention capabilities of memory cell 8.

The continued shrinking of the memory cells, for example, as depicted in the memory cells of FIGS. 1a–b, requires that floating gates 16a–c be reduced in size (e.g., reduced width, length and/or height). The resulting reduced-size memory cell is typically operated with an attendant reduction in the threshold level of electrical charge that is required to program floating gate 16 to a binary 1 state. By way of example, in certain reduced-size memory cells, a binary 1 state can be represented by the electrical charge provided by as few as 5,000 electrons stored within floating gate 16.

Consequently, there is a need to provide a thin, reliable tunnel oxide within a floating gate arrangement. One way to improve the quality of tunnel oxide 15 is to introduce nitrogen into tunnel oxide 15. It has been found, however, that in certain fabrication processes the step of introducing nitrogen into tunnel oxide 15 can lead to reliability/fabrication problems in other devices within the integrated circuit die. Thus, there is need for improved methods and arrangements for introducing nitrogen into the tunnel oxide that avoid introduction of reliability/fabrication problems in other devices.

SUMMARY OF THE INVENTION

These needs and others are met by the present invention, which in accordance with certain aspects, provides methods and arrangements that selectively introduce nitrogen into a dielectric layer, such as, for example, a tunnel oxide in a memory cell. The improved methods and arrangements avoid introducing nitrogen into other areas/regions of the semiconductor integrated circuit die.

Thus, in accordance with certain embodiments of the present invention a method for forming a tunnel oxide in a semiconductor device is provided. The method includes forming a layer of silicon dioxide on a substrate, forming at least one additional layer on the layer of silicon dioxide, selectively patterning the at least one additional layer and the layer of silicon dioxide to form a stacked gate structure, and selectively introducing nitrogen into a portion of the substrate and an adjacent portion of the layer of silicon dioxide within the stacked gate structure. In accordance with certain embodiments of the present invention, the step of selectively introducing nitrogen into the portion of the substrate and the adjacent portion of the layer of silicon dioxide further includes the steps of implanting nitrogen into the portion of the substrate and the adjacent portion of the layer of silicon dioxide within the stacked gate structure, and causing at least a portion of the implanted nitrogen to move into the layer of silicon dioxide within the stacked gate structure by heating the stacked gate structure and the substrate.

In accordance with still other embodiments of the present invention, the step of selectively introducing nitrogen into the portion of the substrate and the adjacent portion of the layer of silicon dioxide further includes the steps of thermally diffusing nitrogen into the portion of the substrate and the adjacent portion of the layer of silicon dioxide within the stacked gate structure, and causing at least a portion of the implanted nitrogen to move into the layer of silicon dioxide within the stacked gate structure by heating the stacked gate structure and the substrate.

In accordance with still further embodiments of the present invention, the step of selectively introducing nitrogen into the portion of the substrate and the adjacent portion of the layer of silicon dioxide can also include the step of maintaining a portion of the layer of silicon dioxide within the stacked gate structure substantially free of nitrogen.

The above stated needs and others are also met by a method for introducing nitrogen into a tunnel oxide within a stacked gate arrangement, in accordance with certain embodiments of the present invention. The method includes forming a stacked gate arrangement having a tunnel oxide and a floating gate on a substrate, selectively implanting impurities into a source region of the substrate, wherein the source region is located adjacent to a first side of the stacked gate arrangement, selectively implanting nitrogen into the source region and at least a portion of the first side of the stacked gate arrangement, and heating at least the stacked gate arrangement to cause at least a portion of the implanted nitrogen to move partially into the tunnel oxide.

The above stated needs and others are also satisfied by a method for introducing nitrogen into a tunnel oxide within a stacked gate arrangement. The method includes the steps of forming a stacked gate arrangement on a substrate, selectively implanting impurities into a source region of the substrate, selectively diffusing nitrogen into the source region and at least a portion of the first side of the stacked gate arrangement, and heating at least the stacked gate arrangement to cause at least a portion of the diffused nitrogen to move partially into the tunnel oxide.

In accordance with yet another aspect of the present invention, a semiconductor device is provided. The semiconductor device includes a substrate having a source region and a drain region, and a tunnel oxide formed on the substrate and over a portion of both the source and drain regions. The tunnel oxide has a nitrogen-rich region over the source region and a substantially nitrogen-free region over the drain region.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

It is known that tunnel oxide 15 can be improved by introducing nitrogen into portions of the silicon dioxide in tunnel oxide 15. For example, it is known that nitrogen can be introduced into tunnel oxide 15 using $N_2O$ gas following and/or during the growth of tunnel oxide 15. Regardless of the method used, the nitrogen is introduced into tunnel oxide 15 prior to the deposition/formation of the overlying floating gate, such as, for example, floating gate 16. Nitrogen is known to reduce hot carrier damage in tunnel oxide 15.

Figure 1A:
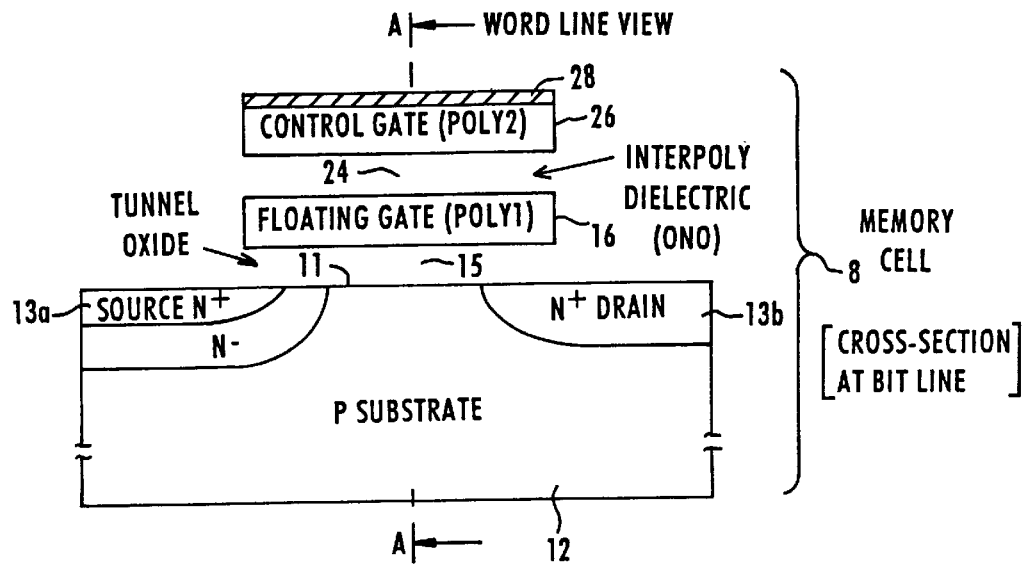
FIG. 1a depicts a cross-sectional view of a portion of a typical prior art semiconductor device having at least one memory cell, as viewed at the bit-line.
Figure 1B:
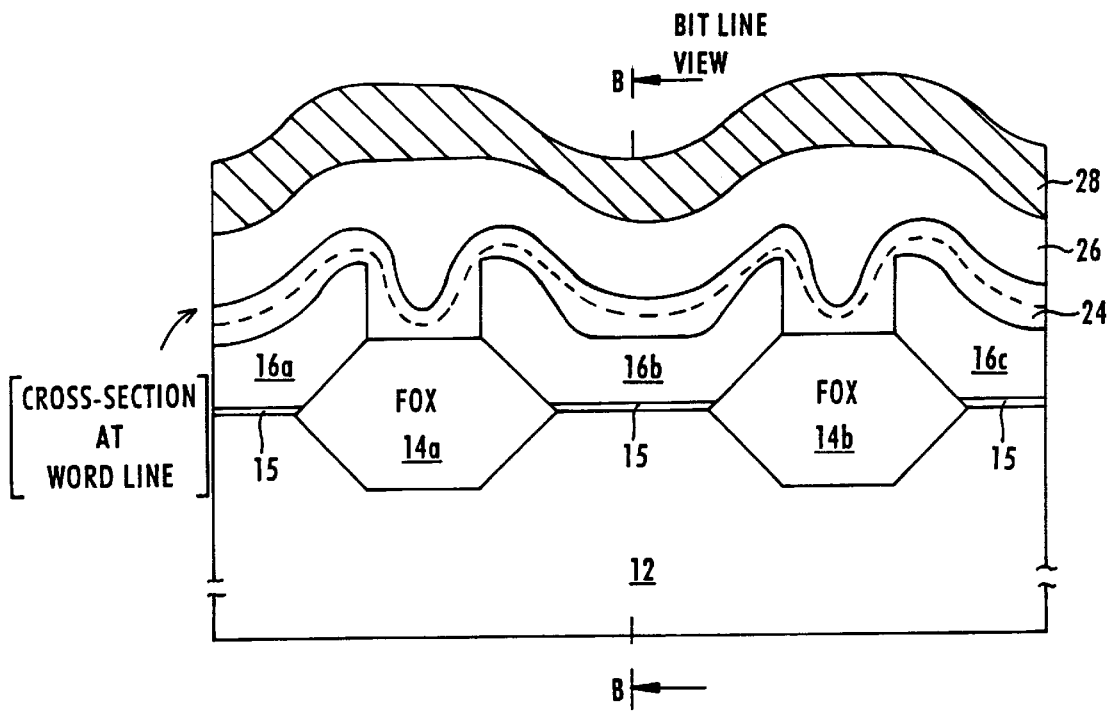
FIG. 1b depicts a cross-sectional view of a portion of a typical prior art semiconductor device, as in FIG. 1a, having at least one memory cell, as viewed at the word-line.
Figure 2A:
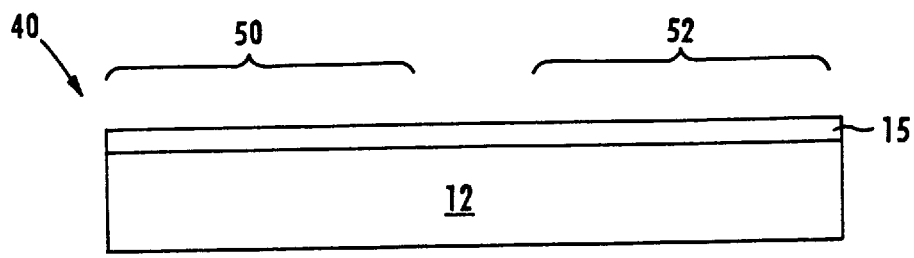
FIG. 2a depicts an enlarged cross-sectional view of part of a conventional semiconductor integrated circuit die having a core area and a periphery area, over which a tunnel oxide, having nitrogen therein, has been formed.

In flash memory circuit die 40, there is typically a core area 50 and a periphery area 52, as depicted in FIG. 2a. Core area 50 usually includes an array of memory cells 8. Periphery area 52 usually includes a variety of driver/ selection devices configured to access memory cells 8 and interface with other outside circuits.

FIGS. 2a–2d sequentially depict some of the stages in a typical fabrication process. In FIG. 2a, a tunnel oxide 15 is formed on substrate 12, covering the entire exposed surface of die 40. Tunnel oxide 15, for example, can be formed using conventional high-temperature diffusion oxidation techniques. If not already included in tunnel oxide 15, nitrogen is introduced into tunnel oxide 15 following formation.

Figure 2B:
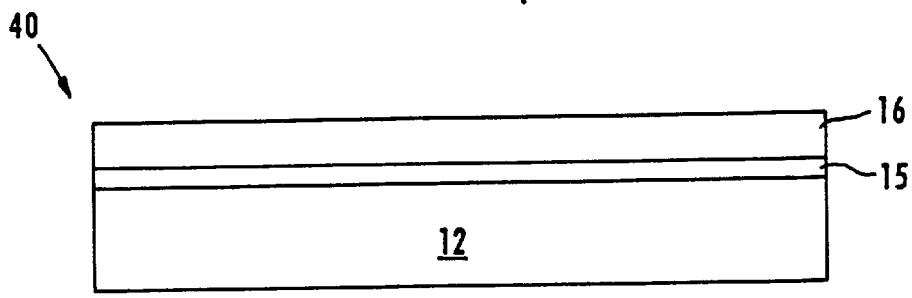
FIG. 2b depicts the cross-sectional view of FIG. 2a, following the formation of a polysilicon layer over the tunnel oxide.
Figure 2C:
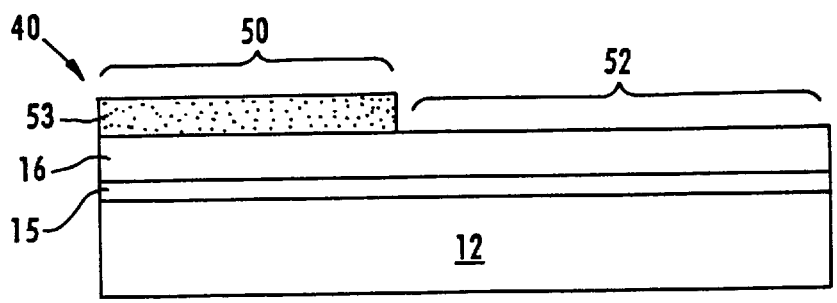
FIG. 2c depicts the cross-sectional view of FIG. 2b, following the formation of a patterned resist mask on the polysilicon layer.

Next, as depicted in FIG. 2b, floating gate 16 is formed on tunnel oxide 15; for example, using conventional chemical vapor deposition (CVD) or plasma enhanced chemical vapor deposition (PECVD) techniques. Once this is done, as depicted in FIG. 2c, a resist mask 53 is formed to protect core area 50 and leave other areas, such as, periphery area 52 exposed. The exposed areas are then etched to remove floating gate 16 material and tunnel oxide 15 material.

Figure 2D:
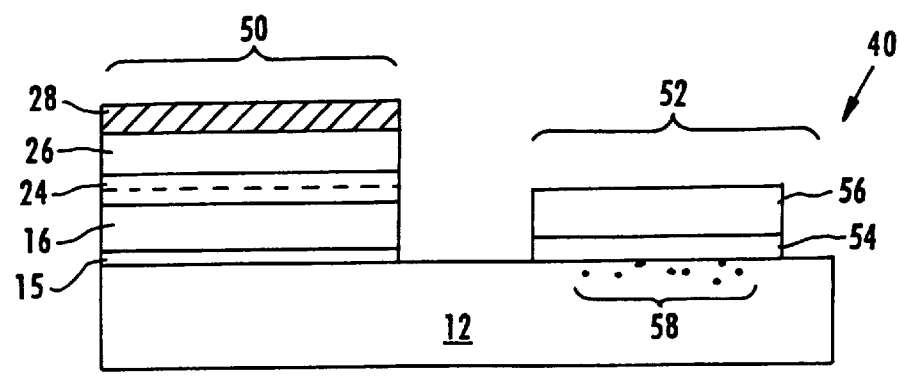
FIG. 2d depicts the cross-sectional view of FIG. 2c, following a selective etching away of the tunnel oxide and polysilicon layer in the periphery area, and the addition of a stacked gate configuration in the core area and a gate oxide and overlying single gate in the periphery area, wherein within the periphery area there is a residual unwanted nitrogen concentration adversely affecting the quality of the gate oxide in the periphery area.

Following selective etching, several additional processes are employed to complete the formation of the devices in core area 50 and periphery area 52. Exemplary device features for both the core area 50 and the periphery area 52 are depicted in FIG. 2d. As shown, within core area 50 an interpoly dielectric layer 24 has been formed on floating gate 16, a control gate 26 has been formed on interpoly dielectric layer 24, and a silicide layer 28 has been formed on control gate 26. In periphery area 52, a gate oxide 54 has been formed on a portion of substrate 12, and a single gate 56 has been formed on gate oxide 54 as part of an exemplary periphery device. Typically, control gate 26 and single gate 56 are formed from the same layer of polysilicon.

It has been found that a portion of the nitrogen that was originally introduced into tunnel oxide 15 can make its way into the upper portions of substrate 12 within peripheral area 52. This unwanted nitrogen 58 is graphically depicted as being located at or near the surface of substrate 12 in FIG. 2d. Unwanted nitrogen 58, unfortunately, can alter the surface of substrate 12, which can be detrimental to the formation of a quality gate oxide 54. If gate oxide 54 is of poor quality (e.g., not uniform in thickness and coverage), then the performance of the periphery device suffers.

Thus, the introduction of nitrogen into the tunnel oxide presents a double-edged sword. On one hand, the nitrogen allows tunnel oxide 15 to have a low electron trap density and superior endurance capabilities (e.g., increased hot carrier injection (HCI)/lifetime). On the other hand, unwanted nitrogen 58 can seriously affect the operation of the devices formed in periphery area 52. Thus, there is a need for improved methods and arrangements for forming a high quality tunnel oxide in the core area without having deleterious consequences to the formation of the gate oxide that is subsequently formed in periphery area 52.

Figure 4:
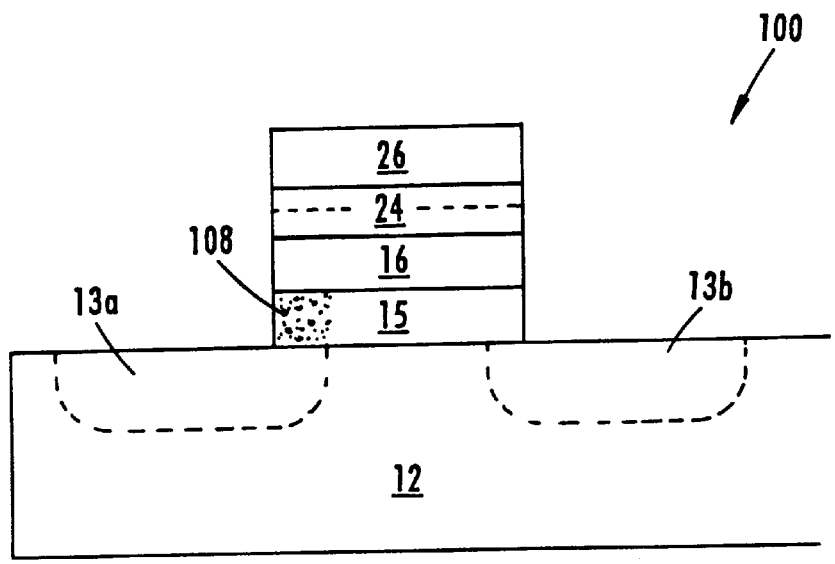
FIG. 4 depicts the cross-sectional view of the portion in FIG. 3, following the introduction of nitrogen into a select portion of the tunnel oxide, and the removal of the isolating resist mask, in accordance with certain embodiments of the present invention.

Memory cell 8 is erased at the source side 13a (FIG. 4) using what is commonly referred to as an "edge erase". Conversely, memory cell 8 is programmed at the drain side 13b. Thus, in accordance with one aspect of the present invention, it was recognized that the nitrogen that is introduced into all of tunnel oxide 15 need only be introduced within the tunnel oxide near the source side to provide many of the same benefits. Indeed, there appears little reason to have nitrogen introduced throughout tunnel oxide 15.

As stated above, the nitrogen is to be introduced on a localized level within tunnel oxide 15. However, the source side region of the memory cell needs to be isolated. There is an existing isolating process that can be modified to further include the step of introducing nitrogen into the source side region of tunnel oxide 15. Consequently, the devices in core area 50 are enhanced by having an improved tunnel oxide 15 where it is most important (i.e., near the source region) and gate oxide 54 associated with devices in periphery area 52 is left undisturbed by unwanted nitrogen 58.

Figure 3:
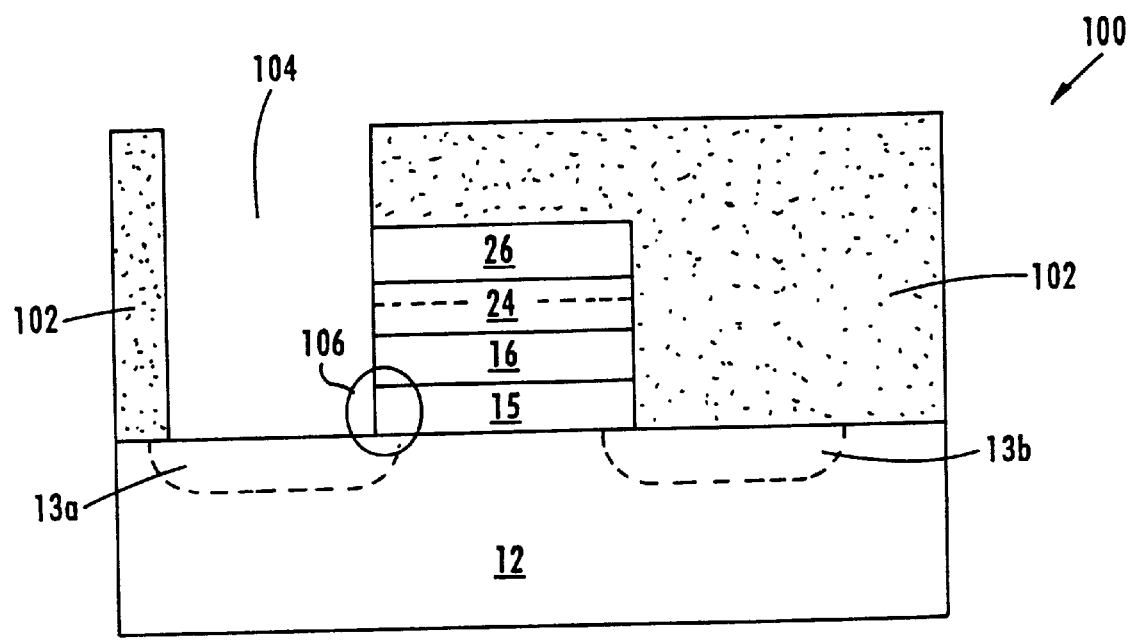
FIG. 3 depicts an enlarged cross-sectional view of a portion of a core area having a stacked gate configuration, in accordance with certain embodiments of the present invention, wherein a selected portion of the tunnel oxide is exposed and subjected to the introduction of nitrogen in a manner that does not leave a residual unwanted nitrogen concentration in other areas, including, for example, a periphery area.

With this in mind, FIG. 3 depicts an exemplary portion 100 of a section of core area 50, during the fabrication of a memory cell 8, in accordance with certain embodiments of the present invention. As shown, a stacked gate arrangement that includes tunnel oxide 15 (without nitrogen), floating gate 16, interpoly dielectric layer 24, and control gate 26 (with or without silicide 28) has been sequentially formed and patterned over substrate 12. A resist mask 102 has been formed over the exposed areas of portion 100. Resist mask 102 forms an opening 104 that is typically used to introduce dopants (e.g., arsenic (As) and/or phosphorus (P)) into substrate 12 to form source region 13a.

In this example, portion 100 has isolated the source side area (i.e., highlighted area 106) of tunnel oxide 15 that is of interest for introducing nitrogen into the tunnel oxide 15. Thus, for example, nitrogen can be introduced into area 106 of tunnel oxide 15 and source region 13a by thermally diffusing or ion implanting nitrogen into tunnel oxide 15 and source region 13a through opening 104, either before or after the source region 13a has been doped. The implanted nitrogen is then preferably further diffused into area 106 of tunnel oxide 15 through subsequent thermal processing, which causes the nitrogen to migrate within tunnel oxide and/or from the source side 13a of substrate 12 into tunnel oxide and extend under a portion of floating gate 16. In this manner, the desired concentration of nitrogen 108 can be achieved within tunnel oxide 15, for example as graphically depicted in the post thermal processing view of portion 100 in FIG. 4.

Those skilled in the art will recognize that there are several benefits to this process and the resulting arrangement, in addition to the performance and reliability benefits described above. For example, since nitrogen can be excluded from drain region 13b, the programming of memory cell 8 is not affected. Similarly, since there is likely to be less nitrogen in the channel region between the source region 13a and drain region 13b, the mobility within the channel region will not be as adversely affected. Further, the amount of implantation-related damage to tunnel oxide 15 is minimized.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a tunnel oxide in a semiconductor device, the method comprising:

forming a layer of silicon dioxide on a substrate;

forming at least one additional layer on the layer of silicon dioxide;

selectively patterning the at least one additional layer and the layer of silicon dioxide to form a stacked gate structure; and selectively introducing nitrogen into a portion of the substrate and an adjacent portion of the layer of silicon dioxide within the formed stacked gate structure.

2. The method as recited in claim 1, wherein the step of selectively introducing nitrogen into the portion of the substrate and the adjacent portion of the layer of silicon dioxide further comprises:

implanting nitrogen into the portion of the substrate and the adjacent portion of the layer of silicon dioxide within the stacked gate structure; and causing at least a portion of the implanted nitrogen to move into the layer of silicon dioxide within the stacked gate structure by heating the stacked gate structure and the substrate.

3. The method as recited in claim 1, wherein the step of selectively introducing nitrogen into the portion of the substrate and the adjacent portion of the layer of silicon dioxide further comprises:

thermally diffusing nitrogen into the portion of the substrate and the adjacent portion of the layer of silicon dioxide within the stacked gate structure; and causing at least a portion of the diffused nitrogen to move into the layer of silicon dioxide within the stacked gate structure by heating the stacked gate structure and the substrate.

4. The method as recited in claim 1, wherein the step of selectively introducing nitrogen into the portion of the substrate and the adjacent portion of the layer of silicon dioxide further comprises maintaining a portion of the layer of silicon dioxide within the stacked gate structure substantially free of nitrogen.

5. A method for introducing nitrogen into a tunnel oxide within a stacked gate arrangement, the method comprising:

forming a stacked gate arrangement on a substrate, the stacked gate arrangement comprising a tunnel oxide and a floating gate;

selectively implanting impurities into a source region of the substrate, the source region being located adjacent to a first side of the stacked gate arrangement;

selectively introducing nitrogen into the source region and at least a portion of the first side of the stacked gate arrangement; and heating at least the stacked gate arrangement to cause at least a portion of the introduced nitrogen to move partially into the tunnel oxide.

6. The method as recited in claim 5, wherein the step of selectively introducing nitrogen including implanting nitrogen into the source region.

7. The method as recited in claim 5, wherein the step of selectively introducing nitrogen includes diffusing nitrogen into the source region.

\* \* \* \* \*